United States Patent
Kawahata et al.

(10) Patent No.: US 9,772,354 B2
(45) Date of Patent: Sep. 26, 2017

(54) OUTPUT CIRCUIT WITH LIMITED OUTPUT VOLTAGE RANGE AND REDUCED POWER CONSUMPTION AND CURRENT SENSOR HAVING THE SAME

(71) Applicant: ALPS ELECTRIC CO., LTD., Tokyo (JP)

(72) Inventors: Ken Kawahata, Miyagi-ken (JP); Masahiko Ota, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 51 days.

(21) Appl. No.: 14/979,065

(22) Filed: Dec. 22, 2015

(65) Prior Publication Data

US 2016/0190929 A1  Jun. 30, 2016

(30) Foreign Application Priority Data

Dec. 26, 2014  (JP) ................. 2014-266769

(51) Int. Cl.
*G01R 15/20*  (2006.01)
(52) U.S. Cl.
CPC ........... *G01R 15/20* (2013.01); *G01R 15/207* (2013.01)
(58) Field of Classification Search
CPC ..... G01R 15/20; G01R 15/207; H02M 3/156; H02M 3/158; H03K 19/0175
See application file for complete search history.

(56) References Cited

U.S. PATENT DOCUMENTS

| | | | | |
|---|---|---|---|---|
| 7,629,834 B2* | 12/2009 | Ogawa | ................. | H03G 11/00 327/309 |
| 8,040,118 B2* | 10/2011 | Cho | .................... | G05F 1/565 323/273 |
| 8,237,505 B2* | 8/2012 | Nishikawa | ........ | H03F 3/45085 330/253 |
| 2002/0125871 A1* | 9/2002 | Groom | ............... | H02M 3/156 323/284 |
| 2006/0261792 A1 | 11/2006 | Liao et al. | | |

FOREIGN PATENT DOCUMENTS

JP         2000-56841        2/2000

* cited by examiner

*Primary Examiner* — Minh N Tang
(74) *Attorney, Agent, or Firm* — Beyer Law Group LLP

(57) ABSTRACT

If an output voltage increases higher than a first limit voltage, a first output transistor is controlled such that the output voltage approaches the first limit voltage, and if the output voltage decreases lower than a second limit voltage, a second output transistor is controlled such that the output voltage approaches the second limit voltage. As a result, it is possible to limit the range of the output voltage and to reduce power consumption, without an increase in an output current at the time of limiter operation, differently from a voltage limiter circuit of the related art.

8 Claims, 9 Drawing Sheets

OUTPUT CIRCUIT WITH LIMITED OUTPUT VOLTAGE RANGE AND REDUCED POWER CONSUMPTION AND CURRENT SENSOR HAVING THE SAME

CLAIM OF PRIORITY

This application claims benefit of Japanese Patent Application No. 2014-266769 filed on Dec. 26, 2014, which is hereby incorporated by reference.

BACKGROUND OF THE INVENTION

1. Field of the Invention

The present invention relates to an output circuit which outputs an analog signal and a current sensor having the output circuit, and particularly, to an output circuit in which the range of an output voltage is limited.

2. Description of the Related Art

There is a case in which an output voltage of an amplification circuit, a buffer circuit, or the like needs to be limited to a constant range. In this case, a voltage limiter circuit is used in general. FIG. 9 is a diagram illustrating a configuration of a general voltage limiter circuit of the related art (refer to Japanese Unexamined Patent Application Publication No. 2000-56841). The voltage limiter circuit 100 illustrated in FIG. 9 is configured by a diode 102 and a constant voltage source 103 which are connected in series to each other, and is connected to an output terminal of a buffer circuit 101 configured by an operational amplifier. If an output voltage Vout of the buffer circuit 101 reaches a voltage corresponding to a sum of a voltage of the constant voltage source 103 and a forward voltage of the diode 102, the diode 102 is turned on, a current flowing through the constant voltage source 103 increases, and thereby an increase in the output voltage Vout is limited.

In the voltage limiter circuit 100 illustrated in FIG. 9, a large current flows into the constant voltage source 103 through the diode 102 which is turned on, and thereby an increase in the voltage is limited. However, if an output circuit includes a circuit type with a high current supply capability, such as a push-pull type, an extremely large current flows through the voltage limiter circuit, and thus problems occur in which current consumption increases or an element temperature increases. In addition, since a forward voltage of a diode is greatly varied by temperature, there is also a problem in which the limitation range of an output voltage is changed by temperature.

SUMMARY OF THE INVENTION

The present invention provides an output circuit for decreasing power consumption and correctly limiting the range of an output voltage, and a current sensor having the output circuit.

According to a first aspect of the present invention, an output circuit which outputs an analog signal to an output line in response to an input signal, includes at least one output transistor which is provided in a current path between at least one power supply line and the output line; and at least one control circuit configured to control the output transistor such that an output voltage approaches the limit voltage, if the output voltage which is generated in the output line increases higher than or decreases lower than a predetermined limit voltage.

According to the configuration, if the output voltage which is generated in the output line increases higher than or decreases lower than the predetermined limit voltage, the output transistor provided in a current path between the power supply line and the output line is controlled such that the output voltage approaches the limit voltage. As a result, the range of the output voltage is limited without an increase in a current of the output transistor at the time of limiter operation. In addition, since a negative feedback control of the output transistor is performed such that the output voltage approaches the predetermined limit voltage, the range of the output voltage is correctly limited.

It is preferable that the control circuit includes a differential amplification circuit configured to amplify the difference between the output voltage and the limit voltage; and a feedback control transistor which is provided between a signal path through which a signal is transmitted to a control terminal of the output transistor and the output line, and configured to control a feedback signal from the output line to the signal path in response to an output signal of the differential amplification circuit, if the output voltage increases higher than or decreases lower than the limit voltage.

In this case, it is preferable that the control circuit includes a voltage dividing circuit which generates a divided voltage between a predetermined voltage and the output voltage. It is preferable that the differential amplification circuit amplifies the difference between a threshold voltage, which is set on the basis of a division ratio between the limit voltage and the voltage division circuit, and the divided voltage. It is preferable that the predetermined voltage is set such that the divided voltage approaches an intermediate voltage between the maximum voltage and the minimum voltage of a power supply, compared to the output voltage, if the output voltage is equal to the limit voltage.

According to the configuration, the divided voltage is a voltage close to an intermediate voltage between the maximum voltage and the minimum voltage of a power supply, and thus the configuration of the differential amplification circuit is simple.

In addition, it is preferable that the output circuit includes a first output transistor which is provided in a current path between a first power supply line and the output line; a second output transistor which is provided in a current path between a second power supply line through which a lower voltage than that of the first power supply line is transmitted, and the output line; a first control circuit configured to control the first output transistor such that the output voltage approaches a first limit voltage, if the output voltage increases higher than the first limit voltage; and a second control circuit configured to control the second output transistor such that the output voltage approaches a second limit voltage, if the output voltage decreases lower than the second limit voltage. It is preferable that the first control circuit includes a first differential amplification circuit configured to amplify the difference between the output voltage and the first limit voltage; and a first feedback control transistor which is provided between a signal path through which a signal is transmitted to a control terminal of the first output transistor and the output line, and configured to control a feedback signal from the output line to the signal path in response to an output signal of the first differential amplification circuit, if the output voltage increases higher than the first limit voltage. It is preferable that the second control circuit includes a second differential amplification circuit configured to amplify the difference between the output voltage and the second limit voltage; and a second feedback control transistor which is provided between a signal path through which a signal is transmitted to a control terminal of the second output transistor and the output line, and configured to control a feedback signal from the output line to the signal path in response to an output signal of the second differential amplification circuit, if the output voltage decreases lower than the second limit voltage.

In this case, it is preferable that the first control circuit includes a first voltage dividing circuit configured to generate a first divided voltage between a predetermined voltage lower than the first limit voltage and the output voltage. It is preferable that the first differential amplification circuit amplifies the difference between a first threshold voltage which is set on the basis of a division ratio between the first limit voltage and the first voltage division circuit, and the first divided voltage. It is preferable that the second control circuit includes a second voltage dividing circuit configured to generate a second divided voltage between a predetermined voltage higher than the second limit voltage and the output voltage. It is preferable that the second differential amplification circuit amplifies the difference between a second threshold voltage which is set on the basis of a division ratio between the second limit voltage and the second voltage division circuit, and the second divided voltage.

In addition, it is preferable that the control circuit includes at least one of a third feedback control transistor which is provided between a control terminal of the second output transistor and the first power supply line, and configured to control a voltage of a control terminal of the second output transistor in response to an output signal of the first differential amplification circuit, if the output voltage increases higher than the first limit voltage; and a fourth feedback control transistor which is provided between a control terminal of the first output transistor and the second power supply line, and configured to control a voltage of a control terminal of the first output transistor in response to an output signal of the second differential amplification circuit, if the output voltage decreases lower than the second limit voltage.

It is preferable that the output circuit further includes a complementary drive circuit configured to complementarily operate the first output transistor and the second output transistor in response to the input signal.

It is preferable that the output circuit further includes a bias circuit configured to operate one of the first output transistor and the second output transistor as a constant current source.

It is preferable that the control circuit includes a differential amplification circuit configured to amplify the difference between the output voltage and the limit voltage; and a feedback control transistor which is provided between a signal path through which a signal is transmitted to a control terminal of the output transistor and a voltage supply line through which a predetermined voltage is supplied, and configured to control a voltage of the signal path in response to an output signal of the differential amplification circuit, if the output voltage increases higher than or decreases lower than the limit voltage.

According to another aspect of the present invention, a current sensor includes a magnetic sensor configured to output a detection signal according to a magnetic field caused by a measured current; a coil configured to generate a magnetic field in a direction in which the magnetic field caused by the measured current acting on the magnetic sensor is negated; a coil drive circuit configured to drive the coil so as to keep the balance between the magnetic field caused by the measured current acting on the magnetic sensor and the magnetic field caused by the current flowing through the coil, in response to the detection signal; a resistor configured to detect a current flowing through the coil; and an amplification circuit configured to amplify a voltage which is generated across the resistor. The amplification circuit includes the output circuit according to the first aspect.

According to the present invention, it is possible to reduce power consumption and to correctly limit the range of an output voltage.

DESCRIPTION OF THE PREFERRED EMBODIMENTS

First Embodiment

Figure 1:
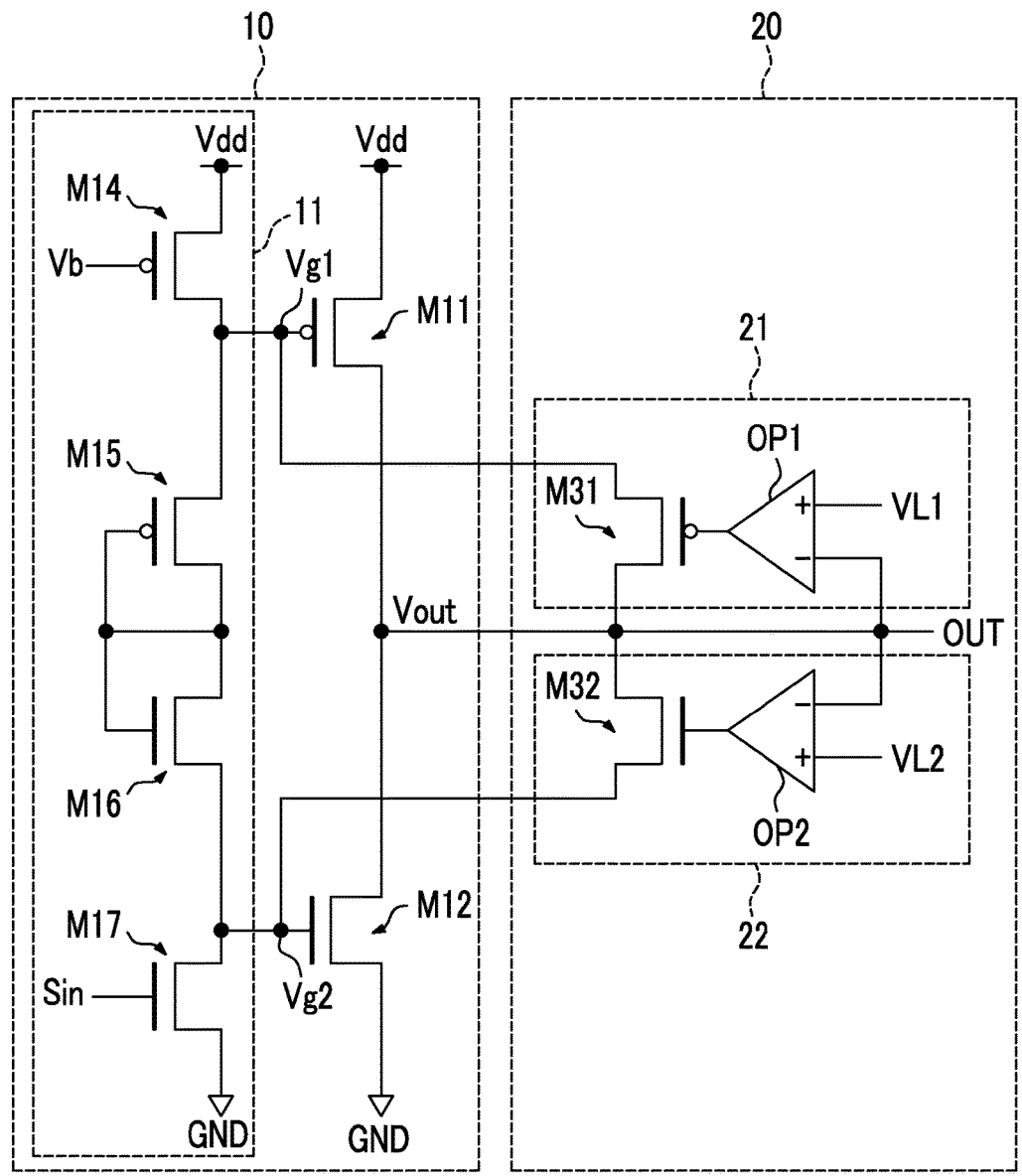
FIG. 1 is a diagram illustrating an example of a configuration of an output circuit according to a first embodiment of the present invention.

FIG. 1 is a diagram illustrating an example of a configuration of an output circuit according to a first embodiment of the present invention.

The output circuit illustrated in FIG. 1 includes an amplification circuit 10 which amplifies an input signal Sin and outputs the amplified input signal to an output line OUT, and a limiter control circuit 20 which performs control for limiting the output voltage Vout of the amplification circuit 10 to a predetermined range.

In an example of FIG. 1, the amplification circuit 10 includes a first output transistor M11 of a PMOS type, a second output transistor M12 of an NMOS type, and a complementary drive circuit 11 which complementarily operates the first output transistor M11 and the second output transistor M12 in response to the input signal Sin.

The first output transistor M11 is provided in a current path between a power supply line (hereinafter, referred to as a "power supply line Vdd") to which a power supply voltage Vdd is supplied, and the output line OUT. A source of the first output transistor M11 is connected to the power supply line Vdd, and a drain of the first output transistor M11 is connected to the output line OUT.

The second output transistor M12 is provided between a current path between a power supply line (hereinafter, referred to as "ground line GND") of a ground potential and the output line OUT. A source of the second output transistor M12 is connected to the ground line GND, and a drain of the second output transistor M12 is connected to the output line OUT.

The complementary drive circuit 11 drives each gate in response to the input signal Sin, such that an output stage which are configured by the first output transistor M11 and the second output transistor M12 operates as a push-pull circuit. In an example of FIG. 1, the complementary drive circuit 11 includes transistors M14 and M15 of a PMOS type and transistors M16 and M17 of an NMOS type. A source of the transistor M14 is connected to the power supply line Vdd, and a drain thereof is connected to a gate of the first output transistor M11. A constant bias voltage Vb is applied to a gate of the transistor M14. A source of the transistor M15 is connected to the gate of the first output transistor M11, and a source thereof is connected to a gate and a drain of the transistor M16. A source of the transistor M16 is connected to a gate of the second output transistor M12. A drain of the transistor M17 is connected to the gate of the second output transistor M12, and a source thereof is connected to the ground GND. The input signal Sin is input to a gate of the transistor M17.

The limiter control circuit 20 controls the first output transistor M11 and the second output transistor M12 in an output stage of the amplification circuit 10, such that the output voltage Vout which is generated in the output line OUT is limited to the range (VL2<Vout<VL1) from a first limit voltage VL1 to a second limit voltage VL2.

The limiter control circuit 20 includes a first control circuit 21 which limits the maximum value of the output voltage Vout to the first limit voltage VL1, and a second control circuit 22 which limits the minimum value of the output voltage Vout to the second limit voltage VL2. If the output voltage Vout increases higher than the first limit voltage VL1, the first control circuit 21 controls the first output transistor M11, such that the output voltage Vout approaches the first limit voltage VL1. In addition, if the output voltage Vout decreases lower than the second limit voltage VL2, the second control circuit 22 controls the second output transistor M12, such that the output voltage Vout approaches the second limit voltage VL2.

In an example of FIG. 1, the first control circuit 21 includes a first feedback control transistor M31 of a PMOS type and a first differential amplification circuit OP1.

The first differential amplification circuit OP1 is a circuit which amplifies the difference between the output voltage Vout and the first limit voltage VL1, and is configured by using, for example, an operational amplifier. The output voltage Vout is input to an inverting input terminal of the first differential amplification circuit OP1, and the first limit voltage VL1 is input to a non-inverting input terminal thereof.

The first feedback control transistor M31 is provided between the gate of the first output transistor M11 and the output line OUT, and if the output voltage Vout increases higher than the first limit voltage VL1, a feedback signal from the output line OUT to the gate of the first output transistor M11 is controlled in response to an output signal of the first differential amplification circuit OP1. A drain of the first feedback control transistor M31 is connected to the gate of the first output transistor M11, a source thereof is connected to the output line OUT, and gate thereof is connected to an output of the first differential amplification circuit OP1.

In addition, in an example of FIG. 1, the second control circuit 22 includes a second feedback control transistor M32 of an NMOS type and a second differential amplification circuit OP2.

The second differential amplification circuit OP2 is a circuit which amplifies the difference between the output voltage Vout and the second limit voltage VL2, and is configured by using, for example, an operational amplifier. The output voltage Vout is input to an inverting input terminal of the second differential amplification circuit OP2, and the second limit voltage VL2 is input to a non-inverting input terminal thereof.

The second feedback control transistor M32 is provided between the gate of the second output transistor M12 and the output line OUT, and if the output voltage Vout decreases lower than the second limit voltage VL2, a feedback signal from the output line OUT to the gate of the second output transistor M12 is controlled in response to an output signal of the second differential amplification circuit OP2. A drain of the second feedback control transistor M32 is connected to the gate of the second output transistor M12, a source thereof is connected to the output line OUT, a gate thereof is connected to an output of the second differential amplification circuit OP2.

Here, an operation of the output circuit according to the present embodiment having the aforementioned configuration will be described.

First, a push-pull operation of the output stage of the amplification circuit 10 will be described.

The transistor M14 operates as a constant current source through which an approximately constant current flows in accordance with the bias voltage Vb which is input to the gate thereof. The gate-source voltages of the transistors M15 and M16 become approximately constant by a constant current of the transistor M14. That is, a voltage difference between the gate of the first output transistor M11 and the gate of the second output transistor M12 becomes approximately constant. For this reason, if a drain voltage of the transistor M17 changes in response to the input signal Sin, gate voltages Vg1 and Vg2 of the first output transistor M11 and the second output transistor M12 change in common.

If a voltage of the input signal Sin increases, a drain voltage of the transistor M17 decreases. As a result, the gate voltage Vg1 of the first output transistor M11 decreases, and thereby a drain current of the first output transistor M11 increases, and the gate voltage Vg2 of the second output transistor M12 decreases, and thereby a drain current of the second output transistor M12 decreases. Accordingly, the output voltage Vout increases.

If the voltage of the input signal Sin decreases, the drain current of the first output transistor M11 decreases, the drain current of the second output transistor M12 increases, and thereby the output voltage Vout decreases, by an operation opposite to the aforementioned operation. Hence, the first output transistor M11 and the second output transistor M12 operate complementarily in response to the input signal Sin.

Next, a limitation operation of the output voltage Vout will be described.

If the output voltage Vout is lower than the first limit voltage VL1, an output voltage of the first differential amplification circuit OP1 becomes a high level (Vdd), and the first feedback control transistor M31 is turned off. In this case, the limitation operation of the output voltage Vout which is performed by the first control circuit 21 is not performed.

If the output voltage Vout is higher than the first limit voltage VL1, the output voltage of the first differential amplification circuit OP1 decreases, and the first feedback control transistor M31 changes from an OFF state to an ON state. The larger the voltage difference "Vout−VL1" is, the smaller the impedance of the first feedback control transistor M31.

Here, the first limit voltage VL1 becomes higher than the gate voltage vg1 of the first output transistor M11. That is, a relationship of "VL1>Vdd−|Vth1|" is satisfied with respect to a threshold voltage Vth1 between the gate and the source of the first output transistor M11. Then, as impedance of the first feedback control transistor M31 decreases, the gate voltage vg1 of the first output transistor M11 increases, and thus a drain current of the first output transistor M11 decreases, and an increase in the output voltage Vout is suppressed. For this reason, if the output voltage Vout increases higher than the first limit voltage VL1, a rapid increase of the output voltage Vout is suppressed, and the output voltage Vout is fixed to approximately the first limit voltage VL1.

On the other hand, if the output voltage Vout is higher than the second limit voltage VL2, an output voltage of the second differential amplification circuit OP2 becomes a low level (GND), the second feedback control transistor M32 is turned off. In this case, a limitation operation of the output voltage Vout which is performed by the second control circuit 22 is not performed.

If the output voltage Vout is lower than the second limit voltage VL2, the output voltage of the second differential amplification circuit OP2 increases, and the second feedback control transistor M32 changes from an OFF state to an ON state. The larger the voltage difference "VL2−Vout" is, the smaller impedance of the second feedback control transistor M32.

Here, the second limit voltage VL2 becomes lower than the gate voltage vg2 of the second output transistor M12. That is, a relationship of "Vth2>VL2" is satisfied with respect to a threshold voltage Vth2 between the gate and the source of the second output transistor M12. Then, as impedance of the second feedback control transistor M32 decreases, the gate voltage vg2 of the second output transistor M12 decreases, and thus a drain current of the second output transistor M12 decreases, and a decrease of the output voltage Vout is suppressed. For this reason, if the output voltage Vout decreases lower than the second limit voltage VL2, a rapid decrease of the output voltage Vout is suppressed, and the output voltage Vout is fixed to approximately the second limit voltage VL2.

As described above, according to the output circuit according to the present embodiment, if the output voltage Vout increases higher than the first limit voltage VL1, the first output transistor M11 is controlled such that the output voltage Vout approaches the first limit voltage VL1, and if the output voltage Vout decreases lower than the second limit voltage VL2, the second output transistor M12 is controlled such that the output voltage Vout approaches the second limit voltage VL2.

As a result, the range of the output voltage Vout can be limited without an increase in an output current when a limiter operates as in the voltage limiter circuit of the related art.

In addition, if the output voltage Vout deviates from a predetermined range, negative feedback controls of the transistors M11 and M12 of the output stage are performed such that the output voltage Vout approaches the limit voltages VL1 and VL2 in accordance with the control circuits 21 and 22, and thus it is possible to correctly limit the range of the output voltage Vout.

Second Embodiment

Next, a second embodiment of the present invention will be described.

Figure 2:
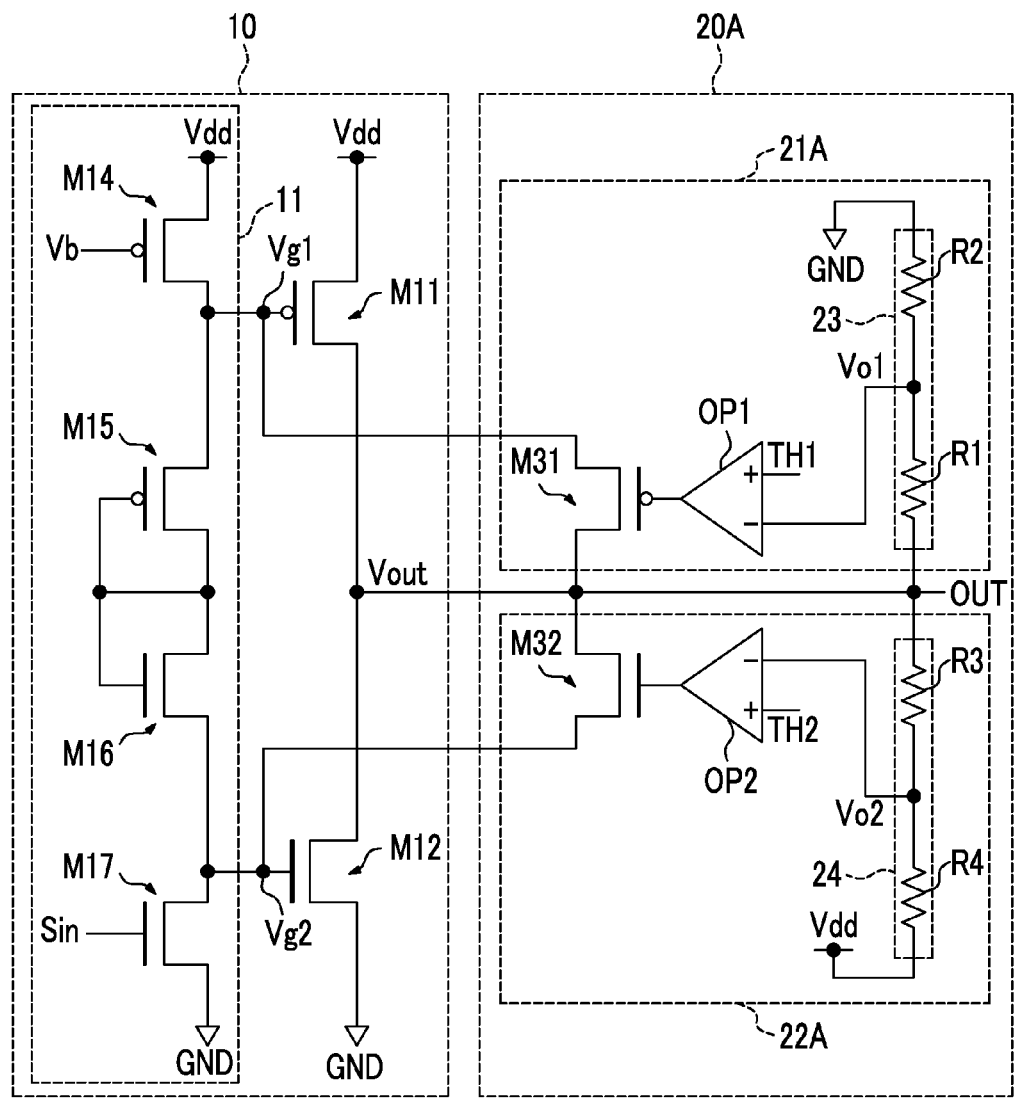
FIG. 2 is a diagram illustrating an example of a configuration of an output circuit according to a second embodiment of the present invention.

FIG. 2 is a diagram illustrating an example of a configuration of an output circuit according to the second embodiment of the present invention. The output circuit illustrated in FIG. 2 is the same as the output circuit illustrated in FIG. 1, except that the limiter control circuit 20 in the output circuit illustrated in FIG. 1 is replaced with a limiter control circuit 20A illustrated in FIG. 2.

The limiter control circuit 20A includes a first control circuit 21A and a second control circuit 22A which control the transistors M11 and M12 of the output stage.

The first control circuit 21A includes a first voltage dividing circuit 23, in addition to the same configuration (the first feedback control transistor M31 and the first differential amplification circuit OP1) as the first control circuit 21 of FIG. 1.

The first voltage dividing circuit 23 is a circuit which generates a divided voltage (a first divided voltage Vo1) between a predetermined voltage and the output voltage Vout. Here, if the output voltage Vout and the first limit voltage VL1 are equal to each other, the "predetermined voltage" is set such that the first divided voltage Vo1 approaches an intermediate value (Vdd/2) between the power supply voltage Vdd and the ground voltage (zero volts), compared to the output voltage Vout. In the example of FIG. 1, the "predetermined voltage" is set to the ground voltage (zero volts) which is lower than the first limit voltage VL1. That is, the first voltage dividing circuit 23 is configured by resistors R1 and R2 which are connected in series between the output line OUT and the ground line GND.

In addition, in the first control circuit 21A, the first differential amplification circuit OP1 amplifies the difference between a first threshold voltage TH1 and the first divided voltage Vo1, and an output thereof is input to a gate of the first feedback control transistor M31. The first threshold voltage TH1 is a voltage which is set on the basis of a division ratio between the first voltage dividing circuit 23 and the first limit voltage VL1, and is represented by the following equation.

Equation 1

$$TH1 = (R1/(R1+R2)) \times VL1 \qquad (1)$$

When the first divided voltage Vo1 is equal to the first threshold voltage TH1, the output voltage Vout is equal to the first limit voltage VL1.

The second control circuit 22A includes a second voltage dividing circuit 24, in addition to the same configuration (the second feedback control transistor M32 and the second differential amplification circuit OP2) as the second control circuit 22 of FIG. 1.

The second voltage dividing circuit 24 is a circuit which generates a divided voltage (a second divided voltage Vo2) between a predetermined voltage and the output voltage Vout. Here, if the output voltage Vout and the second limit voltage VL2 are equal to each other, the "predetermined voltage" is set such that the second divided voltage Vo2 approaches an intermediate value (Vdd/2) between the power supply voltage Vdd and the ground voltage (zero volts), compared to the output voltage Vout. In the example of FIG. 1, the "predetermined voltage" is set to the power supply voltage Vdd which is higher than the second limit voltage VL2. That is, the second voltage dividing circuit 24 is configured by resistors R3 and R4 which are connected in series between the output line OUT and the power supply line Vdd.

In addition, in the second control circuit 22A, the second differential amplification circuit OP2 amplifies the difference between a second threshold voltage TH2 and the second divided voltage Vo2, and an output thereof is input to a gate of the second feedback control transistor M32. The second threshold voltage TH2 is a voltage which is set on the basis of a division ratio between the second voltage dividing circuit 24 and the second limit voltage VL2, and is represented by the following equation.

Equation 2

$$TH2=(R3 \times Vdd+R4 \times VL1)/(R3+R4) \qquad (2)$$

When the second divided voltage Vo2 is equal to the second threshold voltage TH2, the output voltage Vout is equal to the second limit voltage VL2.

The limitation operation of the output circuit illustrated in FIG. 2 having the aforementioned configuration is approximately the same as the output circuit illustrated in FIG. 1. That is, if the output voltage Vout increases higher than the first limit voltage VL1, the first output transistor M11 is controlled such that the output voltage Vout approaches the first limit voltage VL1, and if the output voltage Vout decreases lower than the second limit voltage VL2, the second output transistor M12 is controlled such that the output voltage Vout approaches the second limit voltage VL2.

The difference between the output circuits illustrated in FIG. 1 and FIG. 2 is that the divided voltages Vo1 and Vo2 are input to the first differential amplification circuit OP1. When the output voltage Vout reaches the limit voltages VL1 and VL2, the divided voltages Vo1 and Vo2 become a voltage close to an intermediate value (Vdd/2) of the power supply voltage Vdd, compared to the limit voltages VL1 and VL2.

The first limit voltage VL1 is a voltage involved in the range of "Vdd>VL1>Vdd−|Vth1|", and is a voltage quite close to the power supply voltage Vdd. In addition, the second limit voltage VL2 is a voltage involved in the range of "Vth2>VL2>0", and is a voltage quite close to the ground voltage. In the output circuit illustrated in FIG. 1, it is necessary for the differential amplification circuits OP1 and OP2 to amplify a voltage close to the maximum limit (Vdd) or minimum limit (zero volts) in such a way, and thus there is a problem that a circuit configuration of the differential amplification circuits OP1 and OP2 is complicated. Contrast to this, in the output circuit illustrated in FIG. 2, the differential amplification circuits OP1 and OP2 may amplify the voltage close to the intermediate value (Vdd/2) of the power supply voltage Vdd, and thus it is possible to perform a differential amplification with a simple circuit configuration.

Third Embodiment

Next, a third embodiment of the present invention will be described.

Figure 3:
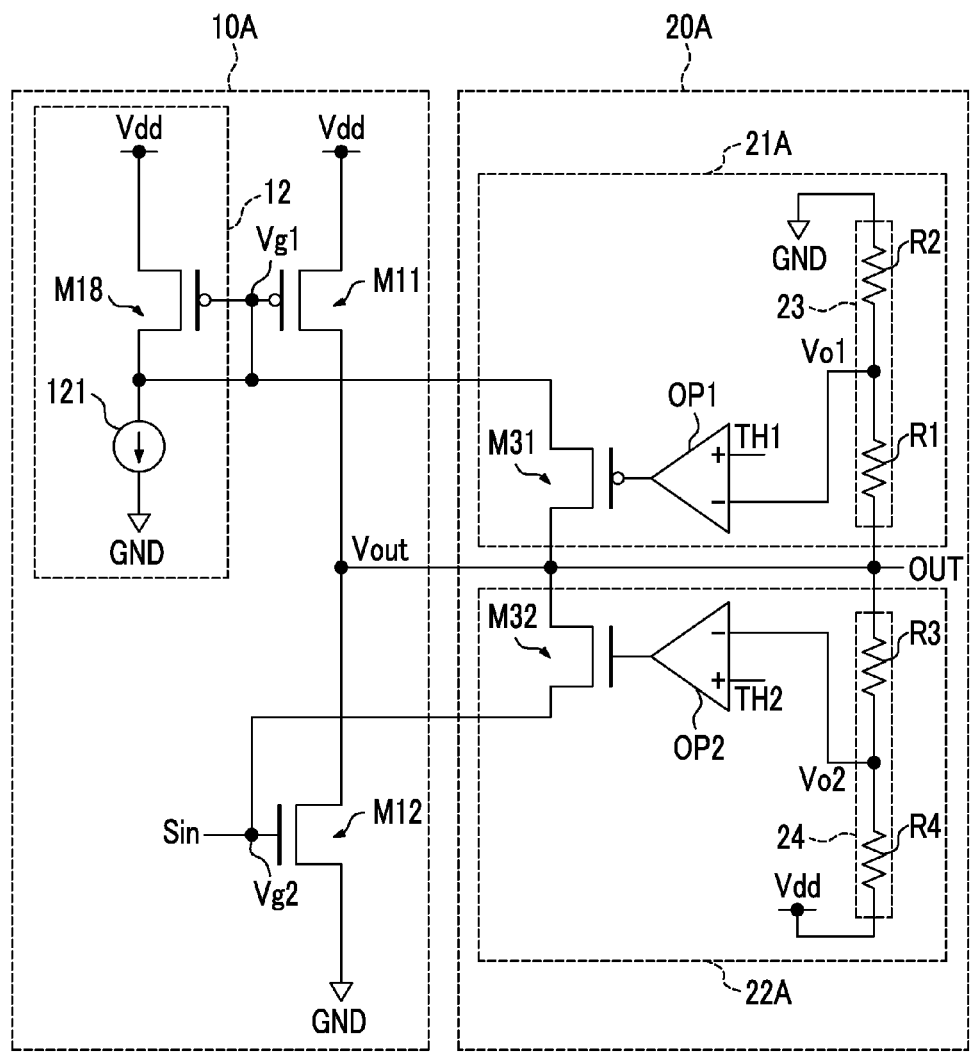
FIG. 3 is a diagram illustrating an example of a configuration of an output circuit according to a third embodiment of the present invention.

FIG. 3 is a diagram illustrating an example of a configuration of an output circuit according to a third embodiment of the present invention. The output circuit illustrated in FIG. 3 is the same as the output circuit illustrated in FIG. 2, except that the amplification circuit 10 in the output circuit illustrated in FIG. 2 is replaced with an amplification circuit 10A illustrated in FIG. 3.

The amplification circuit 10A includes the first output transistor M11 and the second output transistor M12 which are the same as the amplification circuit 10 described above, and includes a bias circuit 12 which operates the first output transistor M11 as a constant current source. The second output transistor M12 operates as an amplification circuit of a source ground type which amplifies the input signal Sin that is input to a gate thereof and outputs the signal from a drain (output line OUT) thereof. In an example of FIG. 3, the bias circuit 12 includes a transistor M18 of a PMOS type and a constant current source 121. A source of the transistor M18 is connected to the power supply line Vdd, and a drain and a gate thereof are connected to the gate of the first output transistor M11. In addition, the constant current source 121 is provided between a drain of the transistor M18 and the ground line GND, and a gate-source voltage of the transistor M18 becomes a constant voltage according to a current of the constant current source 121. The transistor M18 and the first output transistor M11 configure a current mirror circuit, and a constant current according to a current flowing through the constant current source 121 flows into the drain of the first output transistor M11.

In the output circuit illustrated in FIG. 3, if the output voltage Vout is higher than the first limit voltage VL1, the first feedback control transistor M31 is turned on, and thereby a gate voltage of the first output transistor M11 increases, and the output voltage Vout changes to a voltage close to the first limit voltage VL1. In addition, if the output voltage Vout is lower than the second limit voltage VL2, the second feedback control transistor M32 is turned on, and thereby a gate voltage of the second output transistor M12 decreases, and the output voltage Vout changes to a voltage close to the second limit voltage VL2. Hence, in the same manner as the output circuit described above, it is possible to reduce current consumption, and to correctly limit the range of the output voltage Vout using a negative feedback operation.

Fourth Embodiment

Next, a fourth embodiment of the present invention will be described.

Figure 4:
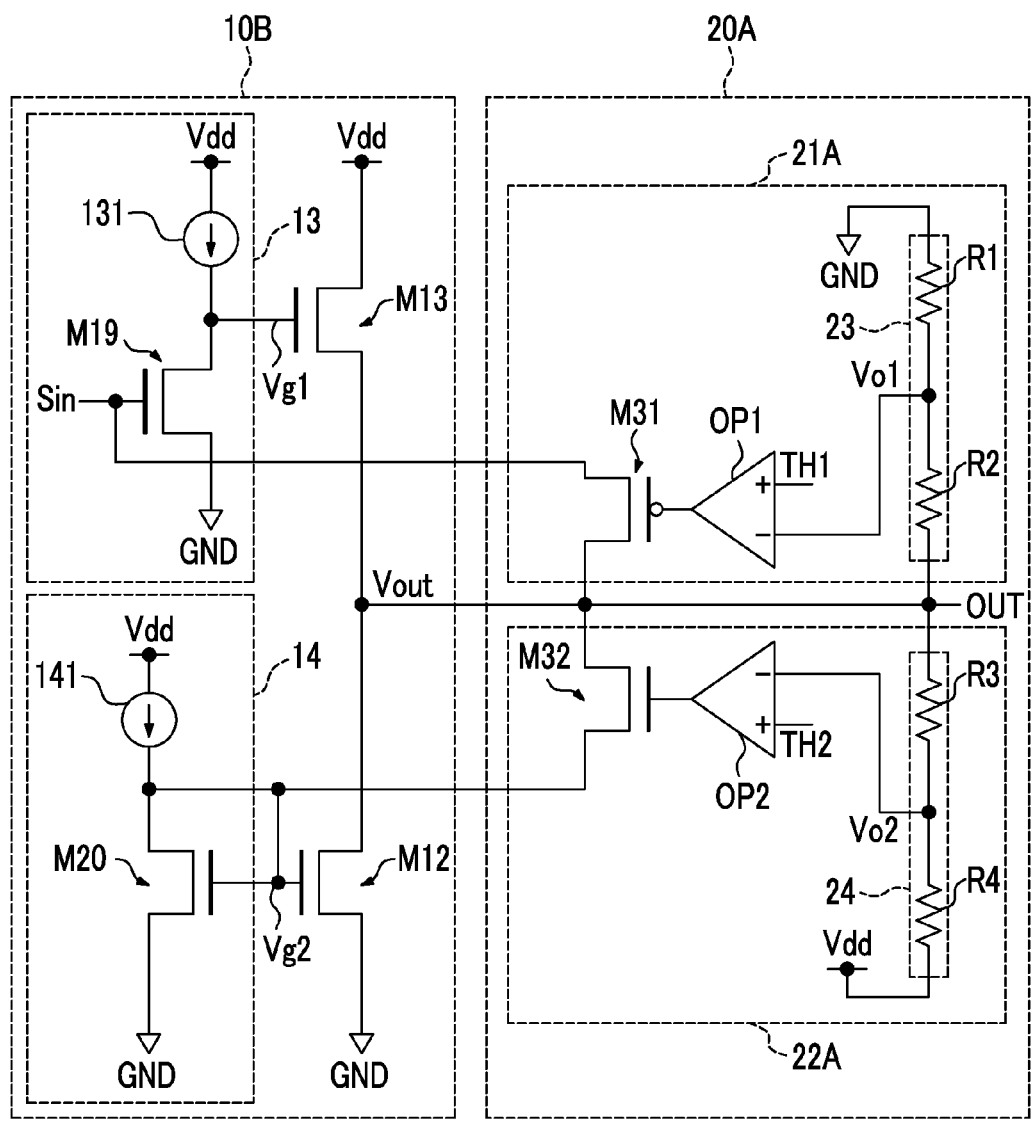
FIG. 4 is a diagram illustrating an example of a configuration of an output circuit according to a fourth embodiment of the present invention.

FIG. 4 is a diagram illustrating an example of a configuration of an output circuit according to a fourth embodiment of the present invention. The output circuit illustrated in FIG. 4 is the same as the output circuit illustrated in FIG. 2, except that the amplification circuit 10 in the output circuit illustrated in FIG. 2 is replaced with an amplification circuit 10B illustrated in FIG. 4.

The amplification circuit 10B includes a first output transistor M13 of an NMOS type which operates as a source follower, an amplification stage 13 which amplifies the input signal Sin and inputs the signal to a gate of the first output transistor M13, a second output transistor M12 of an NMOS type, and a bias circuit 14 which operates the second output transistor M12 as a constant current source.

The first output transistor M13 has a drain connected to the power supply line Vdd, and a source connected to the output line OUT. In addition, the second output transistor M12 has a drain connected to the output line OUT, and a source connected to the ground line GND.

For example, as illustrated in FIG. 4, the amplification stage 13 includes a transistor M19 which operates as an amplification circuit of a source ground type, and a constant current source 131 connected between a drain of the transistor M19 and the power supply line Vdd, as a load. The input signal Sin is input a gate of the transistor M19, and the drain thereof is connected to a gate of the first output transistor M13.

The bias circuit 14 includes a transistor M20 of an NMOS type and a constant current source 141. A source of the transistor M19 is connected to the ground line GND, and a gate thereof is connected to a gate of the second output transistor M12. The constant current source 121 is provided between a drain of the transistor M20 and the power supply line Vdd, and a gate-source voltage of the transistor M20 becomes a constant voltage according to a current of the constant current source 141. The transistor M20 and the second output transistor M12 configure a current mirror, and a constant current according to a current flowing through the constant current source 141 flows into the drain of the second output transistor M12.

The first feedback control transistor M31 of the first control circuit 21A is connected between a gate of the transistor M19 of the amplification stage 13 and the output line OUT. The second feedback control transistor M32 of the second control circuit 22A is connected between the gate of the second output transistor M12 and the output line OUT.

In the output circuit illustrated in FIG. 4, if the output voltage Vout is higher than the first limit voltage VL1, the first feedback control transistor M31 is turned on, a gate voltage of the transistor M19 increases, a drain voltage (gate voltage of the first output transistor M13) of the transistor M19 decreases, and thereby the output voltage Vout changes to a voltage close to the first limit voltage VL1. In addition, if the output voltage Vout is lower than the second limit voltage VL2, the second feedback control transistor M32 is turned on, a gate voltage of the second output transistor M12 decreases, and thereby the output voltage Vout changes to a voltage close to the second limit voltage VL2. Hence, in the same manner as the output circuit described above, it is possible to reduce current consumption, and to correctly limit the range of the output voltage Vout.

Fifth Embodiment

Next, a fifth embodiment of the present invention will be described.

Figure 5:
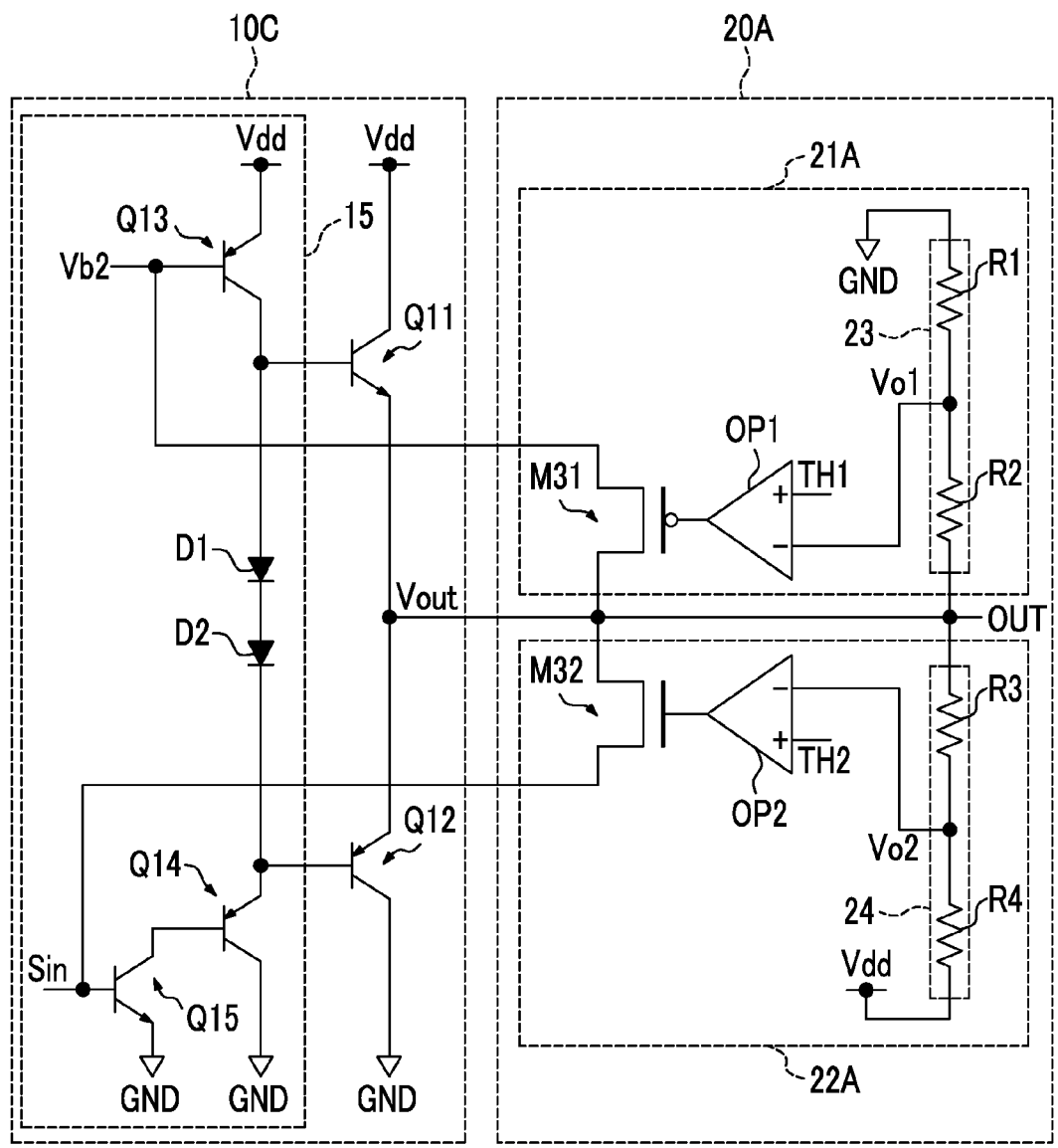
FIG. 5 is a diagram illustrating an example of a configuration of an output circuit according to a fifth embodiment of the present invention.

FIG. 5 is a diagram illustrating an example of a configuration of an output circuit according to a fifth embodiment of the present invention. The output circuit illustrated in FIG. 5 is the same as the output circuit illustrated in FIG. 2, except that the amplification circuit 10 in the output circuit illustrated in FIG. 2 is replaced with an amplification circuit 10C illustrated in FIG. 5.

The amplification circuit 10C is configured by bipolar transistors differently from the amplification circuits 10, 10A, and 10B. The amplification circuit 10C includes a first output transistor Q11 of an NPN type, and a second output transistor Q12 of a PNP, as transistors configuring an output stage. The first output transistor Q11 is provided in a current path between the power supply line Vdd and the output line OUT, and the second output transistor Q12 is provided in a current path between the output line OUT and the ground line GND. In detail, a collector of the first output transistor Q11 is connected to the power supply line Vdd, and an emitter thereof is connected to the output line OUT. An emitter of the second output transistor Q12 is connected to the output line OUT, and a collector thereof is connected to the ground line GND. The first output transistor Q11 and the second output transistor Q12 respectively operate as emitter followers.

In addition, the amplification circuit 10C includes a complementary drive circuit 15 which operates complementarily the first output transistor Q11 and the second output transistor Q12 in response to the input signal Sin. In an example of FIG. 5, the complementary drive circuit 15 includes transistors Q13 and Q14 of a PNP type, a transistor Q15 of an NPN type, and diodes D1 and D2. An emitter of the transistor Q13 is connected to the power supply line Vdd, and a collector thereof is connected to a base of the first output transistor Q11. A constant bias voltage Vb2 is applied to the base of the transistor Q13. The diodes D1 and D2 are connected in series between the base of the first output transistor Q11 and the base of the second output transistor Q12. A collector of the transistor Q14 is connected to the base of the second output transistor Q12, and an emitter thereof is connected to the ground line GND. A collector of the transistor Q15 is connected to a base of the transistor Q14, and an emitter thereof is connected to the ground line GND. The input signal Sin is input to a base of the transistor Q15.

The transistor Q13 operates as a constant current source through which an approximately constant current flows in accordance with the bias voltage Vb2 which is input to the base thereof. A voltage difference between the base of the first output transistor Q11 and the base of the second output transistor Q12 becomes approximately constant by forward voltages of the diodes D1 and D2 which are connected in series. For this reason, if a collector current (a base current of the transistor Q14) of the transistor Q15 changes in response to the input signal Sin, a collector current of the transistor Q14 changes in accordance with this, and base voltages of the first output transistor Q11 and the second output transistor Q12 change in common.

If a voltage of the input signal Sin increases, a base current of the transistor Q14 increases, and thereby a collector voltage of the transistor Q14 decreases, the base voltages of the first output transistor Q11 and the second output transistor Q12 decrease, and the output voltage Vout decreases. If the voltage of the input signal Sin decreases, the base voltages of the first output transistor Q11 and the second output transistor Q12 increase, and the output voltage Vout increases, by an operation opposite to the above operation. Hence, the first output transistor Q11 and the second output transistor Q12 operate complementarily in response to the input signal Sin.

In the output circuit illustrated in FIG. 5, if the output voltage Vout is higher than the first limit voltage VL1, the first feedback control transistor M31 is turned on, a base voltage of the transistor Q13 increases, a collector voltage of the transistor Q13 decreases, a base voltage of the first output transistor Q11 decreases, and thereby the output voltage Vout changes to a voltage close to the first limit voltage VL1.

In addition, if the output voltage Vout is lower than the second limit voltage VL2, the second feedback control transistor M32 is turned on, a base voltage of the transistor Q15 decreases, a collector current (base current of the transistor Q14) of the transistor Q15 decreases, an emitter voltage of the transistor Q14 increases, base voltages of the first output transistor Q11 and the second output transistor Q12 increase, and thereby the output voltage Vout changes to a voltage close to the second limit voltage VL2. Hence, in the same manner as the output circuit described above, it is possible to reduce current consumption, and to correctly limit the range of the output voltage Vout using a negative feedback operation.

Sixth Embodiment

Next, a sixth embodiment of the present invention will be described.

Figure 6:
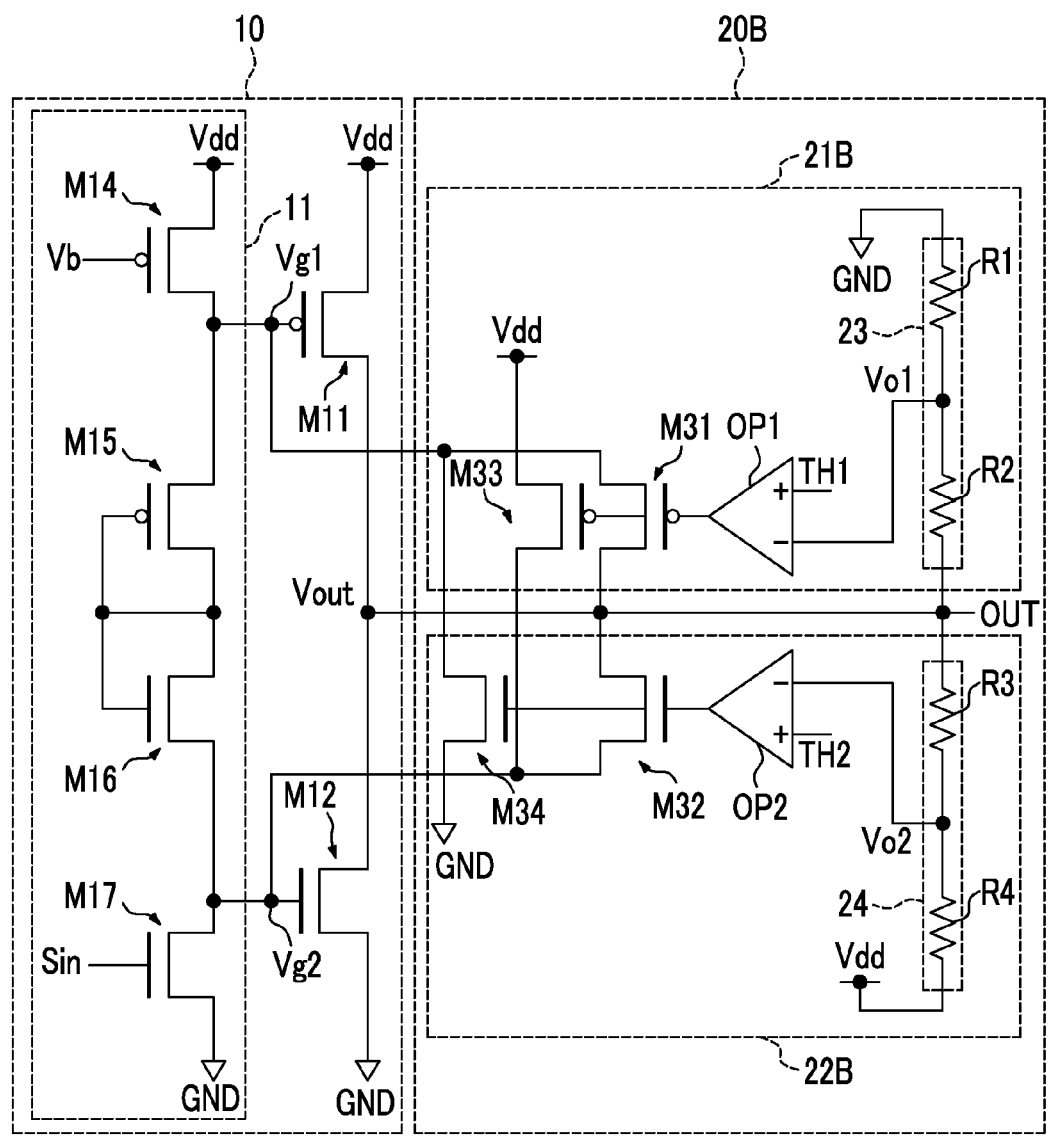
FIG. 6 is a diagram illustrating an example of a configuration of an output circuit according to a sixth embodiment of the present invention.

FIG. 6 is a diagram illustrating an example of a configuration of an output circuit according to a sixth embodiment of the present invention. The output circuit illustrated in FIG. 6 is the same as the output circuit illustrated in FIG. 1, except that the limiter control circuit 20 in the output circuit illustrated in FIG. 1 is replaced with a limiter control circuit 20B illustrated in FIG. 6.

The limiter control circuit 20B includes a first control circuit 21B and a second control circuit 22B which respectively perform controls of transistors M1 and M2 of an output stage.

The first control circuit 21B includes a third feedback control transistor M33 of a PMOS type, in addition to the same configuration (first feedback control transistor M31, first differential amplification circuit OP1, and first voltage dividing circuit 23) as the first control circuit 21A illustrated in FIG. 2. The third feedback control transistor M33 is provided between a gate of the second output transistor M12 and the power supply line Vdd, and if the output voltage Vout increases higher than the first limit voltage VL1, a gate voltage of the second output transistor M12 is controlled in response to an output signal of the first differential amplification circuit OP1. A source of the third feedback control transistor M33 is connected to the power supply line Vdd, a drain thereof is connected to a gate of the second output transistor M12, and the output signal of the first differential amplification circuit OP1 is input to a gate thereof.

The second control circuit 22B includes a fourth feedback control transistor M34 of an NMOS type, in addition to the same configuration (second feedback control transistor M32, second differential amplification circuit OP2, and second voltage dividing circuit 24) as the first control circuit 22A illustrated in FIG. 2. The fourth feedback control transistor M34 is provided between a gate of the first output transistor M11 and the ground line GND, and if the output voltage Vout decreases lower than the second limit voltage VL2, a gate voltage of the first output transistor M11 is controlled in response to an output signal of the second differential amplification circuit OP2. A source of the fourth feedback control transistor M34 is connected to the ground line GND, a drain thereof is connected to a gate of the first output transistor M11, and an output signal of the second differential amplification circuit OP2 is input to a gate thereof.

The first control circuit 21B and the second control circuit 22B which have the aforementioned configurations perform a limitation operation of the output voltage Vout as below.

If the output voltage Vout is lower than the first limit voltage VL1, an output voltage of the first differential amplification circuit OP1 becomes a high level (Vdd), the first feedback control transistor M31 and the third feedback control transistor M33 are turned off in common, and thus a limitation operation performed by the first control circuit 21 is not performed.

If the output voltage Vout is higher than the first limit voltage VL1, an output voltage of the first differential amplification circuit OP1 decreases, and the first feedback control transistor M31 and the third feedback control transistor M33 change from an OFF state to an ON state. The larger a voltage difference "Vout−VL1" is, the smaller the impedances of the first feedback control transistor M31 and the third feedback control transistor M33 is. Here, as the impedance of the first feedback control transistor M31 decreases, the gate voltage Vg1 of the first output transistor M11 increases, and this point is the same as the limiter control circuits 20 and 20A described above. In addition to this operation, the impedance of the third feedback control transistor M33 decreases in the limiter control circuit 20B, and thereby the gate voltage Vg2 of the second output transistor M12 increases. If the gate voltage vg2 increases, a drain current of the second output transistor M12 increases (impedance decreases), and thus the output voltage Vout is urged to change toward a low voltage.

Since the gate voltage vg1 is a voltage (Vdd−|Vth1|) which is relatively close to the power supply voltage Vdd, the gate voltage vg1 cannot increase to a voltage enough to provide the output voltage Vout through the first feedback control transistor M31, and it may be difficult to decrease the output voltage Vout to the first limit voltage VL1. In the second control circuit 22B, the third feedback control transistor M33 connected to the power supply line Vdd is turned on, and thereby the gate voltage Vg2 of the second output transistor M12 increases, a drain current of the second output transistor M12 increases, and the output voltage Vout is urged to change toward a low voltage. For this reason, even though the gate voltage vg1 of the first output transistor M11 is close to the power supply voltage Vdd, it is possible to correctly control a maximum value of the output voltage Vout so as to be close to the first limit voltage VL1.

Meanwhile, if the output voltage Vout is higher than the second limit voltage VL2, an output voltage of the second differential amplification circuit OP2 becomes a low level (GND), the second feedback control transistor M32 and the fourth feedback control transistor M34 are turned off in common, and thus a limitation operation of the output voltage Vout performed by the second control circuit 22 is not performed.

If the output voltage Vout is lower than the second limit voltage VL2, the output voltage of the second differential amplification circuit OP2 increases, the second feedback control transistor M32 and the fourth feedback control transistor M34 change from an OFF state to an ON state. The larger a voltage difference "VL2−Vout" is, the smaller the impedances of the second feedback control transistor M32 and the fourth feedback control transistor M34 are. Here, as the impedance of the second feedback control transistor M32 decreases, the gate voltage Vg2 of the second output transistor M12 increases, and this point is the same as the limiter control circuits 20 and 20A described above. In the limiter control circuit 20B, in addition to the operation, as the impedance of the fourth feedback control transistor M34 decreases, the gate voltage vg1 of the first output transistor M11 decreases. If the gate voltage vg1 decreases, a drain current of the first output transistor M11 increases (impedance decreases), and thus the output voltage Vout is urged to change toward a high voltage.

Since the gate voltage vg2 is a voltage (Vth2) which is relatively close to the ground voltage (zero volts), the gate voltage vg2 cannot decrease to a voltage enough to provide the output voltage Vout through the third feedback control transistor M33, and it may be difficult to increase the output voltage Vout to the second limit voltage VL2. In the second control circuit 22B, the fourth feedback control transistor M34 connected to the ground line HND is turned on, and thereby the gate voltage Vg1 of the first output transistor M11 decreases, a drain current of the first output transistor M11 increases, and the output voltage Vout is urged to change toward a high voltage. For this reason, even though the gate voltage vg2 of the second output transistor M12 is close to the power supply voltage Vdd, it is possible to correctly control a minimum value of the output voltage Vout so as to be close to the second limit voltage VL2.

In this way, according to the output circuit according to the present embodiment, if the limitation operation of the output voltage Vout is performed, feedback controls of the output transistors M11 and M22 which configure the output stage are respectively performed, and thereby it is possible to more correctly control the range of the output voltage Vout.

Seventh Embodiment

Next, a seventh embodiment of the present invention will be described.

Figure 7:
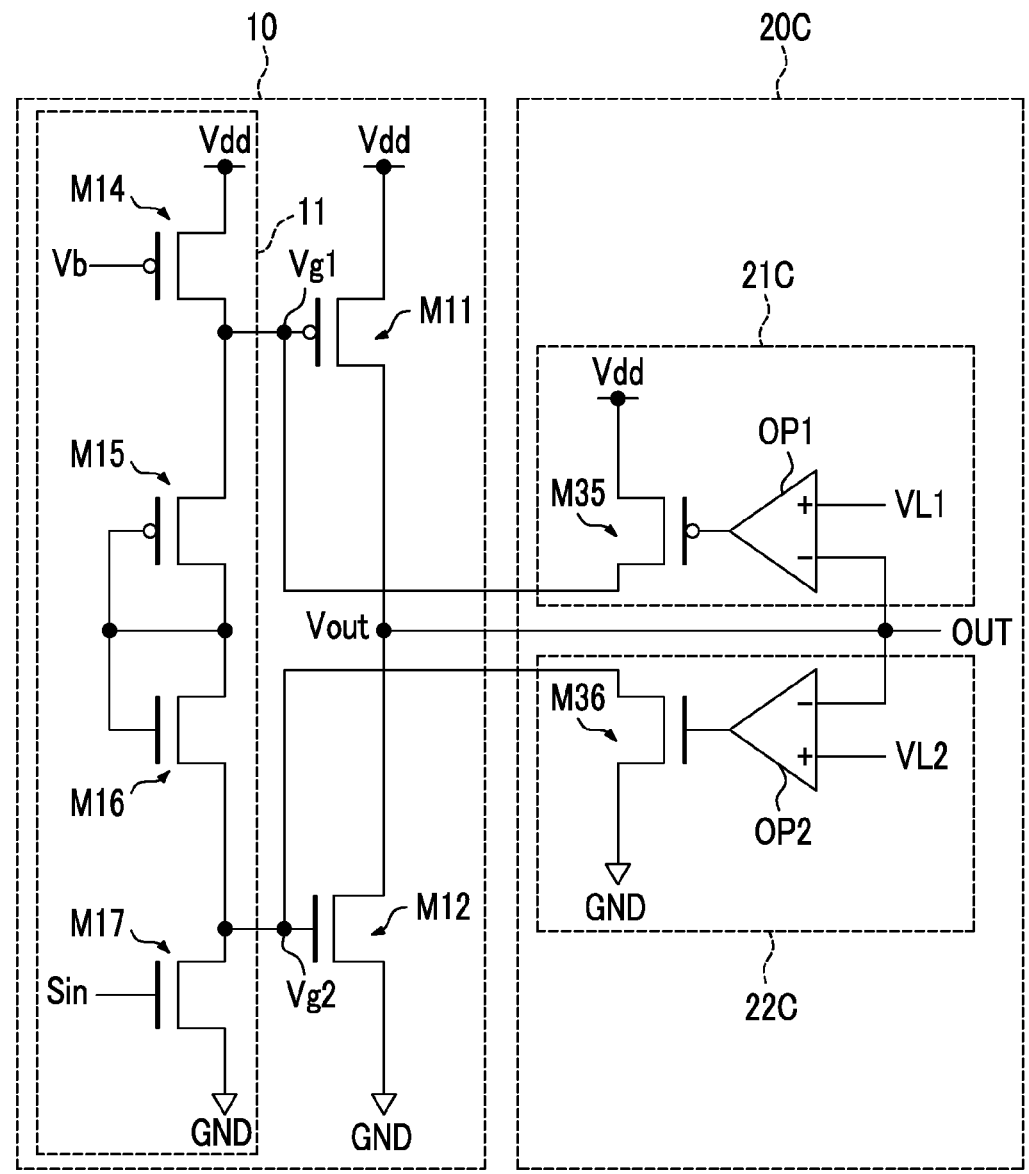
FIG. 7 is a diagram illustrating an example of a configuration of an output circuit according to a seventh embodiment of the present invention.

FIG. 7 is a diagram illustrating an example of a configuration of an output circuit according to a seventh embodiment of the present invention. The output circuit illustrated in FIG. 7 is the same as the output circuit illustrated in FIG. 1, except that the limiter control circuit 20 in the output circuit illustrated in FIG. 1 is replaced with a limiter control circuit 20C illustrated in FIG. 6.

The limiter control circuit 20C includes a first control circuit 21C and a second control circuit 22C which perform controls of transistors M1 and M2 of an output stage.

The first control circuit 21C includes a feedback control transistor M35 of a PMOS type and a first differential amplification circuit OP1.

The first differential amplification circuit OP1 is the same as the configuration element with the same symbols or reference numerals as those included in the first control circuit 21 described above.

The feedback control transistor M35 is provided between a gate of the first output transistor M11 and power supply line Vdd, and if the output voltage Vout increases higher than the first limit voltage VL1, the gate voltage vg1 of the first output transistor M11 is controlled in response to an output signal of the first differential amplification circuit OP1. A drain of the feedback control transistor M35 is connected to the gate of the first output transistor M11, source thereof is connected to the power supply line Vdd, and a gate thereof is connected to an output of the first differential amplification circuit OP1.

The second control circuit 22C includes a feedback control transistor M36 of an NMOS type, and the second differential amplification circuit OP2.

The second differential amplification circuit OP2 is the same as the configuration element with the same symbols or reference numerals as those included in the second control circuit 22 described above.

The feedback control transistor M36 is provided between a gate of the second output transistor M12 and the ground line GND, and if the output voltage Vout decreases lower than the second limit voltage VL2, the gate voltage vg2 of the second output transistor M12 is controlled in response to an output signal of the second differential amplification circuit OP2. A drain of the feedback control transistor M36 is connected to the gate of the second output transistor M12, source thereof is connected to the ground line GND, and a gate thereof is connected to an output of the second differential amplification circuit OP2.

If the output voltage Vout is lower than the first limit voltage VL1, an output voltage of the first differential amplification circuit OP1 becomes a high level (Vdd), the feedback control transistor M35 is turned off. In this case, a limitation operation of the output voltage Vout performed by the first control circuit 21C is not performed.

If the output voltage Vout is higher than the first limit voltage VL1, the output voltage of the first differential amplification circuit OP1 decreases, the feedback control transistor M35 changes from an OFF' state to an ON state. The larger a voltage difference "Vout−VL1" is, the smaller the impedances of the feedback control transistor M35 is, and the gate voltage vg1 of the first output transistor M11 increases toward power supply voltage Vdd. If the gate voltage vg1 increases, a drain current of the first output transistor M11 decreases, and thereby an increase in the output voltage Vout is suppressed. For this reason, if the output voltage Vout is higher than the first limit voltage VL1, a rapid increase of the output voltage Vout is suppressed, and the output voltage Vout is fixed to approximately the first limit voltage VL1.

On the other hand, if the output voltage Vout is higher than the second limit voltage VL2, an output voltage of the second differential amplification circuit OP2 becomes a low level (GND), the feedback control transistor M36 is turned off. In this case, a limitation operation of the output voltage Vout which is performed by the second control circuit 22C is not performed.

If the output voltage Vout is lower than the second limit voltage VL2, the output voltage of the second differential amplification circuit OP2 decreases, and the feedback control transistor M36 changes from an OFF state to an ON state. The larger a voltage difference "VL2−Vout" is, the smaller the impedance of the feedback control transistor M36 is, and the gate voltage Vg2 of the second output transistor M12 decreases toward the ground voltage (aero volts). If the gate voltage Vg2 decreases, a drain current of the second output transistor M12 decreases, and a decrease of the output voltage Vout is suppressed. For this reason, if the output voltage Vout decreases lower than the second limit voltage VL2, a rapid decrease of the output voltage Vout is suppressed, and the output voltage Vout is fixed to approximately the second limit voltage VL2.

As described above, according to the output circuit according to the present embodiment, if the output voltage Vout increases higher than the first limit voltage VL1, the first output transistor M11 is controlled such that the output voltage Vout approaches the first limit voltage VL1, and if the output voltage Vout decreases lower than the second limit voltage VL2, the second output transistor M12 is controlled such that the output voltage Vout approaches the second limit voltage VL2. Hence, in the same manner as in the output circuit according to each embodiment described above, it is possible to reduce current consumption, and to correctly limit the range of the output voltage Vout using a negative feedback operation.

Eighth Embodiment

Next, an eighth embodiment of the present invention will be described.

The present embodiment relates to a current sensor of a magnetic balance type using the output circuit according to the present invention.

Figure 8:
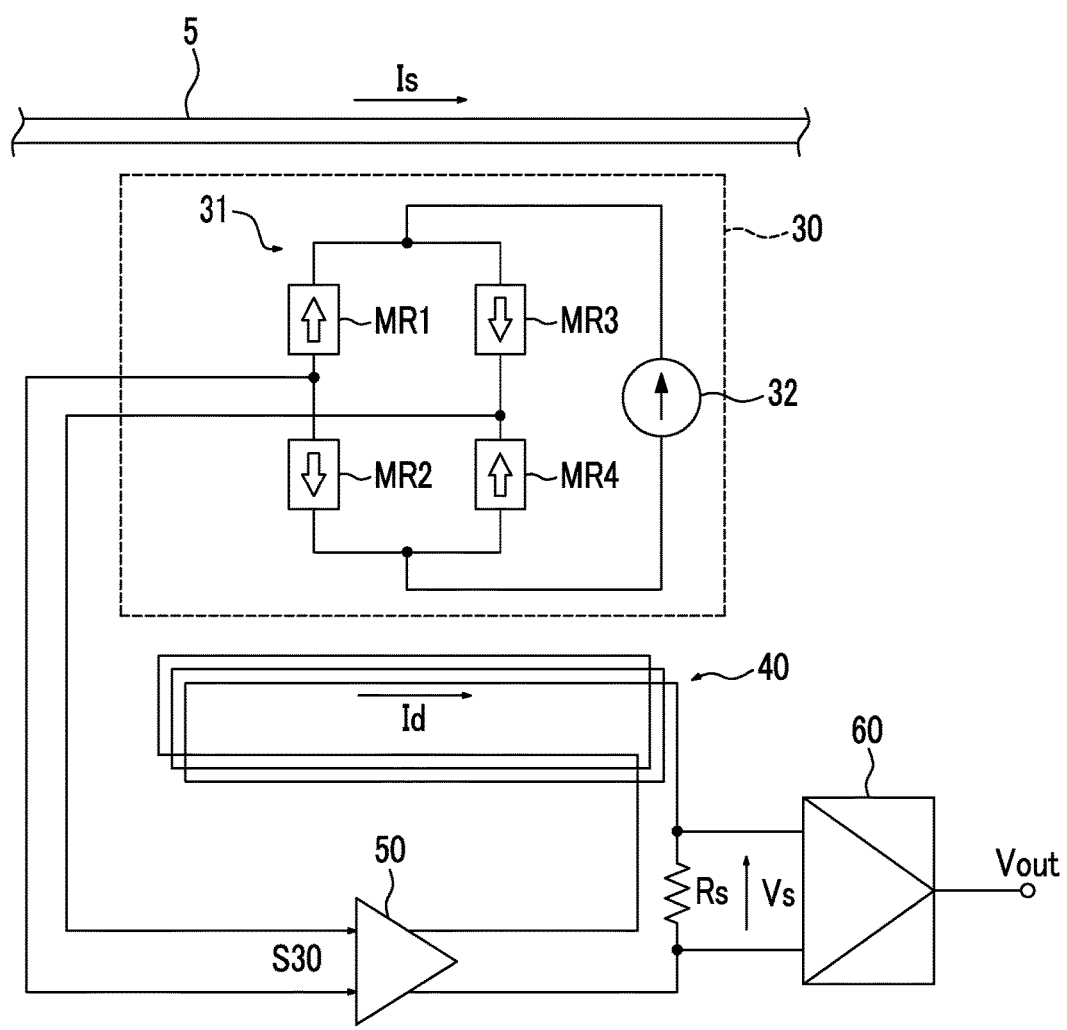
FIG. 8 is a diagram illustrating an example of a configuration of a current sensor according to an embodiment of the present invention.
Figure 9:
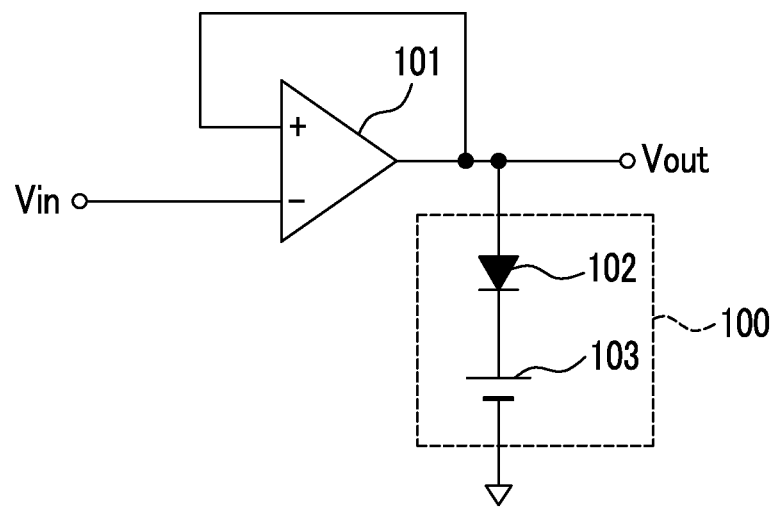
FIG. 9 is a diagram illustrating a configuration of a general voltage limiter circuit of the related art.

FIG. 8 is a diagram illustrating an example of a configuration of a current sensor according to the present embodiment. The current sensor illustrated in FIG. 8 includes a magnetic sensor 30 which outputs a detection signal S30 according to a magnetic field caused by a measured current Is flowing through a conductor 5, a coil 40 that generates a magnetic field in a direction in which the magnetic field caused by the measured current Is acting on the magnetic sensor 30 is negated, a coil drive circuit 50, a shunt resistor Rs, and an amplification circuit 60.

In the example of FIG. 8, the magnetic sensor 30 includes four magnetic resistance effect elements MR1 to MR4 which configure a bridge circuit 31, and a constant current source 32 which supplies a constant current to the bridge circuit 31. If a balance between the magnetic field caused by the measured current Is and the magnetic field caused by a current Id flowing through the coil 40 is kept, the detection signal S30 becomes a predetermined reference level. If the balance between the two magnetic fields is not kept, the detection signal S30 becomes greater than the reference level, or smaller than the reference level, in accordance with the magnitude of the two magnetic fields.

The coil drive circuit 50 drives the coil 40 so as to keep a balance between the magnetic field caused by the measured current Is acting on the magnetic sensor 30 and the magnetic field caused by the current Id flowing through the coil 40, in response to the detection signal S30 which is output from the magnetic sensor 30. That is, the coil drive circuit 50 performs a negative feedback control of the current Id of the coil 40, such that a level of the detection signal 30 is the same as the reference level described above.

The current Id of the coil 40 is approximately proportional to the measured current Is, and represents a measured result of the measured current Is. The current Id is output as a voltage Vs which is generated across the shunt resistor Rs connected to the coil 40, as illustrated in, for example, FIG. 8.

The amplification circuit 60 amplifies a voltage Vs which is generated across the shunt resistor Rs in accordance with the current Id flowing through the coil 40, and output the amplified result as an output voltage Vout. Since the output voltage Vout is limited to a predetermined range, the amplification circuit 60 includes an output circuit according to the present embodiment of the present invention described above. For example, the amplification circuit 60 is formed inside a semiconductor IC, and outputs the output voltage Vout of the amplified result to a controller or the like, which is not illustrated, in the outside of the semiconductor IC. By limiting the output voltage Vout of the amplification circuit 60 within a predetermined range, the output voltage Vout out of the range can be used for an abnormal notification function of a semiconductor IC. For example, as an abnormality sensing circuit provided inside a semiconductor IC forcibly makes the output voltage Vout deviate from a limit range of the amplification circuit 60 when abnormality is sensed, it is possible to notify of occurrence of abnormality outside the semiconductor IC without providing a dedicated terminal for abnormality notification.

As such, the embodiments of the present invention are described, but the present invention is not limited to the aforementioned embodiments, and includes various variations. That is, the circuit configurations which are used for the aforementioned embodiments are just examples, and can be replaced with other circuits which represent the same function. Transistors which configure a circuit are not limited to MOS type transistors, and may use other type transistors such as a bipolar type transistor.

In addition, combinations of amplification circuits 10, 10A, 10B, and 10C, and limiter control circuits 20, 20A, 20B, and 20C which are used as examples according to the present embodiments described above are not limited to the examples illustrated in FIG. 1 to FIG. 7, and other combinations are also included in the embodiments of the present invention.

In addition, in the embodiments described above, an example in which the power supply voltage Vdd is supplied through one of the two power supply lines, and the ground voltage is supplied through the other supply line, is used, but the present invention is not limited to the example. Other embodiments of the present invention may have a power supply line through which a positive voltage with respect to a ground voltage is supplied and another power supply line through which a negative voltage with respect to a ground voltage is supplied. In this case, by controlling output transistors which are respectively provided between two power supply lines of a negative type and a positive type, the output voltage may be limited within a predetermined range.

It should be understood by those skilled in the art that various modifications, combinations, sub-combinations and alterations may occur depending on design requirements and other factors insofar as they are within the scope of the appended claims of the equivalents thereof.

What is claimed is:

1. A output circuit for outputting an analog signal to an output line in response to an input signal, the output circuit comprising:
   at least one output transistor provided in a current path between at least one power supply line and the output line, and configured to output an output voltage to the output line; and
   at least one control circuit,
   wherein:
   the at least one power supply line includes:
      a first power supply line; and
      a second power supply line having a lower voltage than the first power supply line;
   the at east one output transistor includes:
      a first output transistor provided in a first current path between the first power supply line and the output line; and
      a second output transistor provided in a second current path between the second power supply line and the output line;
   the at least one control circuit includes:
      a first control circuit configured to control the first output transistor such that the output voltage on the output line approaches a first limit voltage, if the output voltage becomes higher than the first limit voltage; and
      a second control circuit configured to control the second output transistor such that the output voltage on the output line approaches a second limit voltage, if the output voltage becomes lower than the second limit voltage,
   wherein the first control circuit includes:
      a first differential amplification circuit configured to amplify a difference between a first input voltage corresponding to the output voltage on the output line and a first threshold voltage corresponding to the first limit voltage; and
      a first feedback control transistor provided in a first signal path between a control terminal of the first output transistor and the output line, and configured to control a first feedback signal from the output line to the first signal path in response to an output signal of the first differential amplification circuit, if the output voltage becomes higher than the first limit voltage,
   wherein the second control circuit includes:
      a second differential amplification circuit configured to amplify a difference between a second input voltage corresponding to the output voltage on the output line and a second threshold voltage corresponding to the second limit voltage; and a second feedback control transistor provided in a second signal path between a control terminal of the second output transistor and the output line, and configured to control a second feedback signal from the output line to the second signal path in response to an output signal of the second differential amplification circuit, if the output voltage becomes lower than the second limit voltage, and wherein the at least one control circuit further includes at least one of:

a third feedback control transistor provided between the control terminal of the second output transistor and the first power supply line, and configured to control a voltage of the control terminal of the second output transistor in response to the output signal of the first differential amplification circuit, if the output voltage becomes higher than the first limit voltage; and a fourth feedback control transistor provided between the control terminal of the first output transistor and the second power supply line, and configured to control a voltage of the control terminal of the first output transistor in response to the output signal of the second differential amplification circuit, if the output voltage becomes lower than the second limit voltage.

2. The output circuit according to claim 1, wherein the first control circuit further includes a first voltage dividing circuit configured to generate a first divided voltage between a first predetermined voltage lower than the first limit voltage and the output voltage on the output line as the first input voltage for the first amplification circuit, wherein the first threshold voltage is set based on the first limit voltage and a division ratio of the first voltage division circuit, wherein the second control circuit further includes a second voltage dividing circuit configured to generate a second divided voltage between a second predetermined voltage higher than the second limit voltage and the output voltage on the output line as the second input voltage for the second amplification circuit, and wherein the second threshold voltage is set based on the second limit voltage and a division ratio of the second voltage division circuit.

3. The output circuit according to claim 1, further comprising:

a complementary drive circuit configured to complementarily operate the first output transistor and the second output transistor in response to the input signal.

4. The output circuit according to claim 1, further comprising:

a bias circuit configured to operate one of the first output transistor and the second output transistor as a constant current source.

5. The output circuit according to claim 1, wherein the input voltage for the differential amplification circuit is the output voltage on the output line, and the threshold voltage is the limit voltage which is close to a maximum voltage or a minimum voltage of a power supply.

6. The output circuit according to claim 1, wherein the first and the second input voltages are the output voltages on the output line, and wherein the first and the second threshold voltages are the first and the second limit voltages which are close to a maximum voltage and a minimum voltage of a power supply, respectively.

7. A current sensor comprising:

a magnet sensor configured to output a detection signal according to a magnetic field generated by a current to be measured and applied thereto;

a coil configured to generate a canceling magnetic field in a direction in which the magnetic field applied to the magnetic sensor from the current to be measured is canceled;

a coil drive circuit configured to drive the coil with a driving current so as to balance the canceling magnetic field with the magnetic field applied to the magnetic sensor from the current to be measured in response to the detection signal;

a resistor configured to detect the driving current flowing through the coil; and an amplification circuit configured to amplify a voltage which is generated across the resistor, the amplification circuit including an output circuit for outputting an analog signal to an output line in response to an input signal, wherein the output circuit comprises:

at least one output transistor provided in a current path between at least one power supply line and the output line, and configured to output an output voltage to the output line; and at least one control circuit configured to control the at least one output transistor such that the output voltage on the output line approaches a first limit voltage if the output voltage becomes higher than the first limit voltage, or such that the output voltage on the output line approaches a second limit voltage if the output voltage becomes lower than the second limit voltage.

8. The current sensor according to claim 7, wherein the at least one control circuit includes:

a differential amplification circuit configured to amplify a difference between the output voltage and the limit voltage; and a feedback control transistor provided in a signal path between a control terminal of the output transistor and a voltage supply line through which a predetermined voltage is supplied, and configured to control a voltage of the signal path in response to an output signal of the differential amplification circuit, if the output voltage on the output line becomes higher than the first limit voltage or lower than the second limit voltage.

* * * * *